(12) United States Patent
Han et al.

(10) Patent No.: US 8,779,565 B2
(45) Date of Patent: Jul. 15, 2014

(54) INTEGRATED CIRCUIT MOUNTING SYSTEM WITH PADDLE INTERLOCK AND METHOD OF MANUFACTURE THEREOF

(75) Inventors: Byung Joon Han, Singapore (SG); Byung Tai Do, Singapore (SG); Arnel Senosa Trasporto, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 363 days.

(21) Appl. No.: 12/967,223

(22) Filed: Dec. 14, 2010

(65) Prior Publication Data

US 2012/0146192 A1 Jun. 14, 2012

(51) Int. Cl.
*H01L 23/495* (2006.01)
*H01L 21/00* (2006.01)

(52) U.S. Cl.
USPC ............... 257/667; 438/123; 257/E23.04

(58) Field of Classification Search
USPC ............. 257/667, E23.015, E23.04, E23.037
See application file for complete search history.

(56) References Cited

U.S. PATENT DOCUMENTS

| | | | |
|---|---|---|---|
| 7,808,089 B2 | 10/2010 | Nguyen et al. | |
| 7,821,113 B2 | 10/2010 | Sahasrabudhe et al. | |
| 7,838,974 B2 | 11/2010 | Poddar et al. | |
| 2007/0278700 A1* | 12/2007 | St. Germain et al. | 257/782 |
| 2009/0152691 A1* | 6/2009 | Nguyen et al. | 257/667 |

* cited by examiner

*Primary Examiner* — Daniel Luke
(74) *Attorney, Agent, or Firm* — Ishimaru & Associates LLP

(57) ABSTRACT

A method of manufacture of an integrated circuit mounting system includes: providing a die paddle with a component side having a die mount area and a recess with more than one geometric shape; applying an adhesive on the die mount area and in a portion of the recess; and mounting an integrated circuit device with an inactive side directly on the adhesive.

20 Claims, 11 Drawing Sheets

INTEGRATED CIRCUIT MOUNTING SYSTEM WITH PADDLE INTERLOCK AND METHOD OF MANUFACTURE THEREOF

TECHNICAL FIELD

The present invention relates generally to an integrated circuit mounting system, and more particularly to a system with paddle interlock.

BACKGROUND ART

Electronic products such as cell phone base products, global positioning systems (GPS), satellites, communication equipment, consumer products, and a vast line of other similar products are in ever increasing global demand. Market growth for high density and high output/input integrated circuit packages has resulted in a trend for electronic products that are lightweight, smaller in size, multi-functional, and capable of ever increasing higher speeds.

Products must be capable of competing in world markets and attracting many consumers or buyers. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit mounting system including: providing a die paddle with a component side having a die mount area and a recess with more than one geometric shape; applying an adhesive on the die mount area and in a portion of the recess; and mounting an integrated circuit device with an inactive side directly on the adhesive.

The present invention provides an integrated circuit mounting system, including: a die paddle with a component side having a die mount area and a recess with more than one geometric shape; an adhesive on the die mount area and in a portion of the recess; and an integrated circuit device with an inactive side directly on the adhesive.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
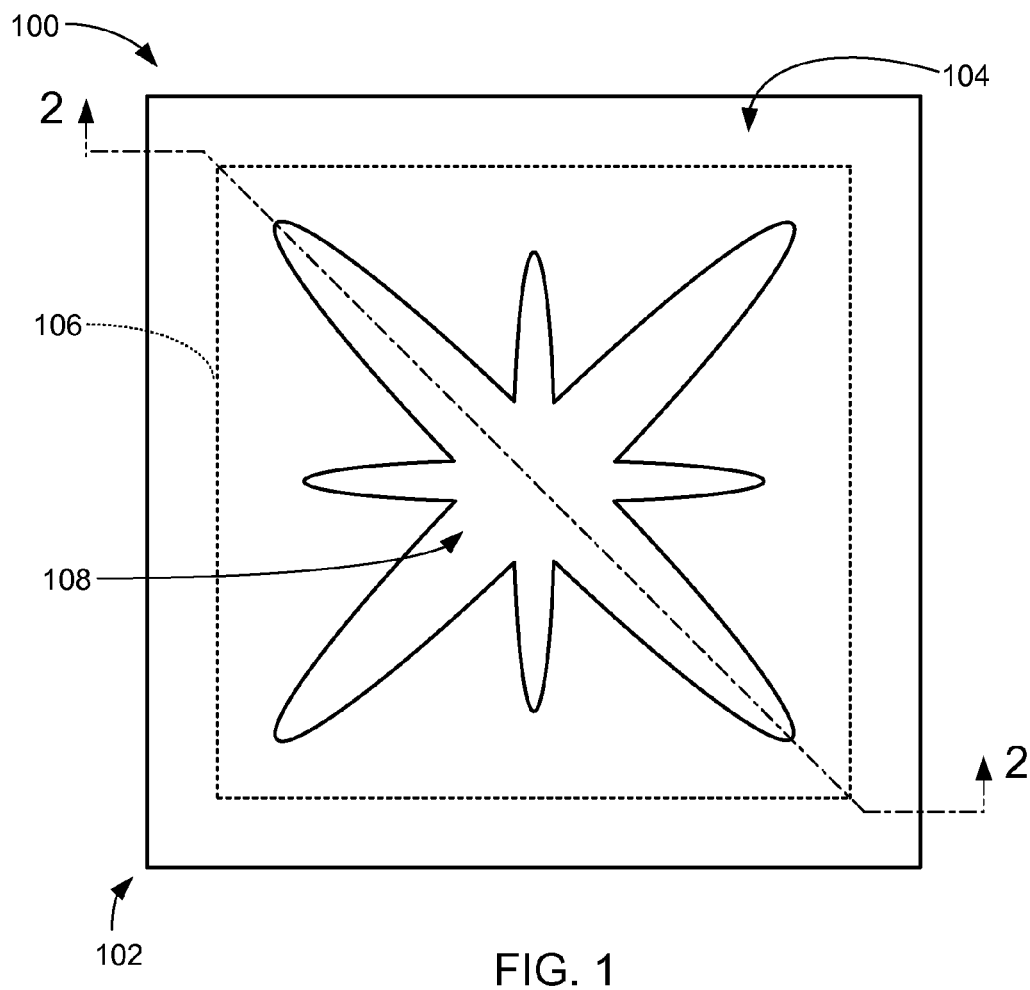
FIG. 1 is a top view of an integrated circuit mounting system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings are shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit mounting system 100 in a first embodiment of the present invention. The integrated circuit mounting system 100 includes a die paddle 102 with a component side 104 and a die mount area 106 (shown with dotted lines) of the component side 104. The die mount area 106 represents a specific location and orientation on the die paddle 102 of a component (not shown) having circuitry.

The die paddle 102 provides a support structure for the component having circuitry, thermal dissipation for the component, a ground plane for the component, an electromagnetic shielding for the circuitry of the component, or a common electrical connect potential for a ground, a power, or an electrical signal. The die paddle 102 can be formed of a conductive material that can include copper or copper alloy and can optionally include surface treatments such as a pre-plated film (ppF) or silver (Ag) although it is understood a surface of the die paddle 102 can be bare.

The die paddle 102 includes one or more of a recess 108 formed in the die paddle 102 within the die mount area 106 using a forming process that can include a stamping process, a laser forming process, an etching process, a grinding process, a routing process, or a mechanized process method. An interior of the recess 108 can optionally include surface treatments such as a pre-plated film (ppF) or silver (Ag) although it is understood surfaces of the recess 108 can be bare.

The recess 108 is formed having a combination of more than one geometric shapes such as lines, curves, or combinations thereof. For example, the recess 108 can have a shape of an asterisk etching design or an extended asterisk etching design.

The recess 108 includes a first geometric shape, a second geometric shape, a third geometric shape, and a fourth geometric shape superimposed on one another. The first geometric shape has a shape of an elongated ellipse positioned from a center region of the die mount area 106 with ends extending horizontally and equidistant from the center point. The second geometric shape has a shape identical to the shape of the first geometric shape and is positioned from the center region with ends extending vertically and equidistant from the center point.

The third geometric shape has a shape of an elongated ellipse positioned from the center region with ends equidistant from the center region to opposing corners of the die mount area 106. The fourth geometric shape has a shape identical to the shape of the third geometric shape and is positioned from the center region with ends and equidistant from the center region to opposing corners of the die mount area 106 located between the opposing corners closest to the ends of the third geometric shape.

The first geometric shape and the second geometric shape have a length that is at least nine times a width of the first geometric shape and the second geometric shape. The recess 108 can be formed within or extend outside a perimeter of the die mount area 106. In an alternative embodiment, the ends of the third geometric shape and the fourth geometric shape protrude beyond corners of the die mount area 106. The widths and lengths of the third geometric shape and the fourth geometric shape are at least twice the widths and lengths of the first geometric shape and the second geometric shape.

The recess 108 has an area that is between sixty percent and ninety percent of an area of the die mount area 106. For example, the recess 108 can have an area that is between seventy percent and seventy-five percent of an area of the die mount area 106. The component side 104 is exposed from and surrounds the recess 108.

Figure 2:
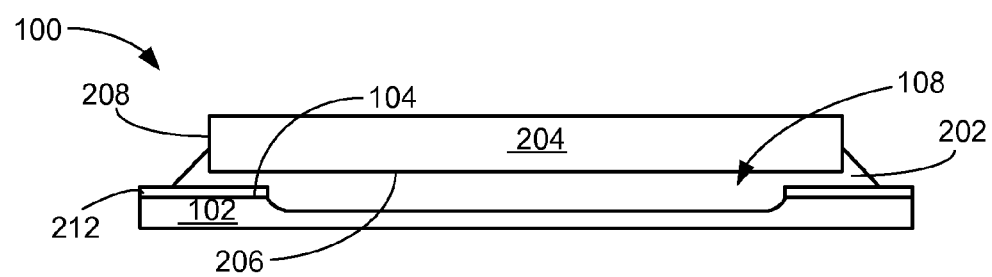
FIG. 2 is a cross-sectional view of FIG. 1 taken along line 2-2.

Referring now to FIG. 2, therein is shown a cross-sectional view of FIG. 1 taken along line 2-2. An adhesive 202 is applied in the recess 108 and on the die mount area 106. The adhesive 202 can cover all or portions of internal sides of the recess 108 in a covering process. The covering process can include cleaning, injecting, or heating processes.

An integrated circuit device 204 is attached directly on the adhesive 202 with the adhesive 202 covering an inactive side 206 of the integrated circuit device 204 using an attachment process. The inactive side 206 refers to a side of the integrated circuit device 204 not having active circuitry fabricated thereon or elements for connection to the active circuitry within the integrated circuit device 204. The attachment process can include positioning, heating, cooling, or mechanical clamping processes.

The adhesive 202 between the integrated circuit device 204 and the die paddle 102 is used to prevents movement of the integrated circuit device 204, protect the inactive side 206, or improve thermal transfer characteristics between the integrated circuit device 204 and the die paddle 102. The adhesive 202 can include a die attach material, a glue, an epoxy, or a thermally conductive adhesive material.

For illustrative purposes, the integrated circuit device 204 is shown having a length similar to the length of a perimeter of the die mount area 106 of FIG. 1. The integrated circuit device 204 can have different lengths or widths.

For example, the integrated circuit device 204 can have a perimeter with a width and a length greater than or equal to a width and a length of a perimeter of the recess 108. The integrated circuit device 204 having the perimeter less than the perimeter of the recess 108 can form a recess relief region (not shown).

The recess relief region provides a vent or outgassing outlet for the adhesive 202 to prevent entrapment of gas or void formations between the inactive side 206 and the recess 108. The adhesive 202 can cover all or a portion of a device side 208 of the integrated circuit device 204.

The die paddle 102 is shown having a surface layer 212 such as one or more of the surface treatments. The surface layer 212 can be optionally applied on the component side 104 surrounding the recess 108. The surface layer 212 can be applied anytime before or during the attachment process. The surface layer 212 on the component side 104 is exposed from and surrounds the recess 108.

It has been discovered that the recess 108 increases the adhesion strength between the die paddle 102 and the integrated circuit device 204 by providing the adhesive 202 with increased surface area and robustness from shear stress due to the additional vertical locking effects of the recess 108 resulting in reductions in manufacturing defects and rework processing.

It has also been discovered that the recess 108 with the adhesive 202 prevents the die paddle 102 from detachments resulting in improved product yields or product reliability.

It has further been discovered that the recess 108 provides both enhanced locking of the adhesive 202 between the integrated circuit device 204 and the die paddle 102 and a capability for the die paddle 102 to be formed with a thickness less than a thickness of typical leadframe die paddles resulting in lower profile or lighter packages.

It has yet further been discovered that the adhesive 202 covering all or a portion of a device side 208 of the integrated circuit device 204 significantly improves product reliability by preventing contaminants from entering between the integrated circuit device 204 and the die paddle 102 by providing additional sealing around the integrated circuit device 204.

Figure 3:
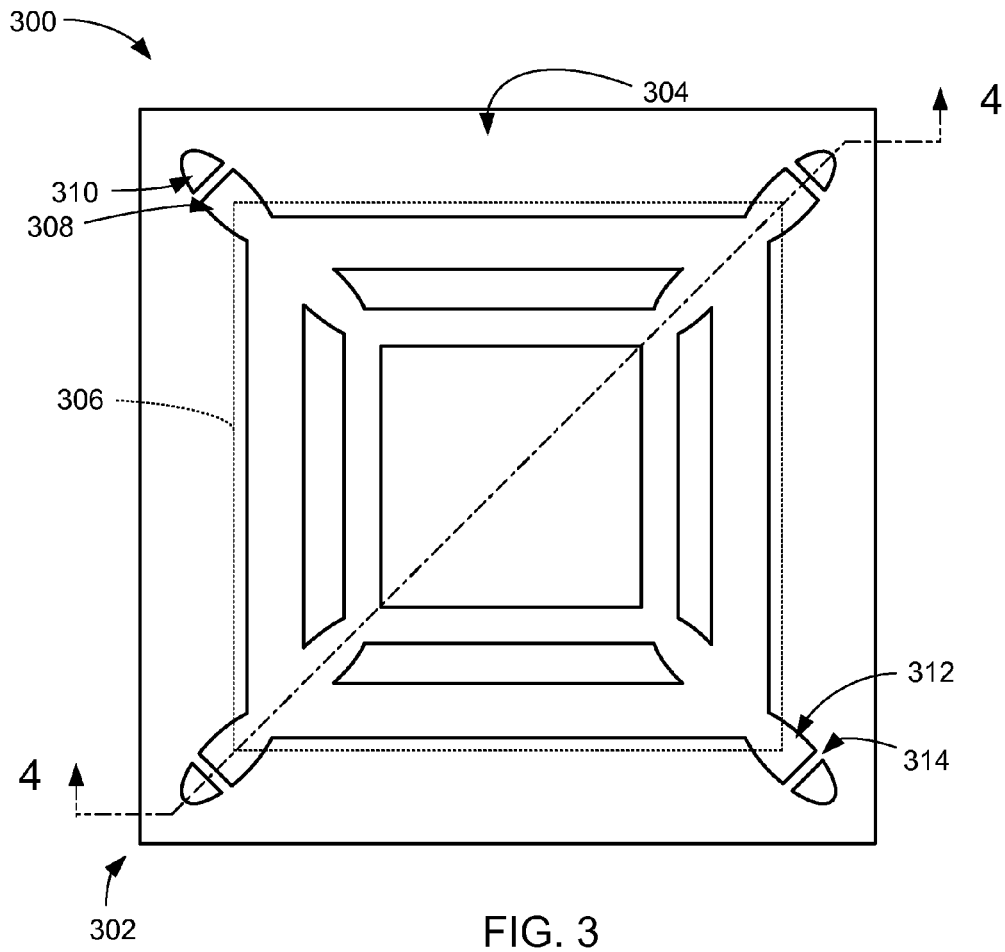
FIG. 3 is a top view of an integrated circuit mounting system in a second embodiment of the present invention.

Referring now to FIG. 3, therein is shown a top view of an integrated circuit mounting system 300 in a second embodiment of the present invention. The integrated circuit mounting system 300 includes a die paddle 302 with a component side 304 and a die mount area 306 (shown with dotted lines) of the component side 304. The die mount area 306 represents a specific location and orientation on the die paddle 302 of a component (not shown) having circuitry.

The die paddle 302 provides a support structure for the component having circuitry, thermal dissipation for the component, a ground plane for the component, an electromagnetic shielding for the circuitry of the component, or a common electrical connect potential for a ground, a power, or an electrical signal. The die paddle 302 can be formed of a conductive material that can include copper or copper alloy and can optionally include surface treatments such as a pre-plated film (ppF) or silver (Ag) although it is understood a surface of the die paddle 302 can be bare.

The die paddle 302 includes one or more of a recess 308 and cavities 310. The recess 308 in the die paddle 302 within and protruding from the die mount area 306 and the cavities 310 in the die paddle 302 are formed using a forming process that can include a stamping process, a laser forming process, an etching process, a grinding process, a routing process, or a mechanized process method. The cavities 310 of the die paddle 302 are formed outside the die mount area 306. An interior of the recess 308 or the cavities 310 can optionally include surface treatments such as a pre-plated film (ppF) or silver (Ag) although it is understood surfaces of the recess 308 and of the cavities 310 can be bare.

The recess 308 is formed having a combination of more than one geometric shapes such as lines, curves, or combinations thereof. For example, the recess 308 can have a shape of a concentric square with separated etching corner design.

The recess 308 includes a first geometric shape, a second geometric shape, third geometric shapes and fourth geometric shapes. The first geometric shape has a shape of a rectangular frame positioned within the second geometric shape. The second geometric shape is similar to the first geometric shape and has a length and width proportionally larger than a length and width of the first geometric shape. The second geometric shape surrounds a perimeter formed by the first geometric shape.

Sides of the first geometric shape are parallel to sides of the second geometric shape. Perimeter centers of the first geometric shape and of the second geometric shape are coincident with a center region of the die mount area 306.

Each of the third geometric shapes are elliptical in shape with curved sides joining an end of the third geometric shapes and an opposite end of the third geometric shapes. The end of each of the third geometric shapes is integral with a corner of the first geometric shape on the perimeter of the first geometric shape. The opposite end of each of the third geometric shapes is integral with a corner of the second geometric shape inside a perimeter of the second geometric shape.

The fourth geometric shapes each have curved sides joining an end of the fourth geometric shapes and an opposite end of the fourth geometric shapes similar to the third geometric shapes with the curved sides, the end, and the opposite end, respectively. The end of each of the fourth geometric shapes is integral with a corner of the second geometric shape on a perimeter of the second geometric shape.

The opposite end of the fourth geometric shapes protrudes towards a corner of a perimeter of the die paddle 302. The opposite end of the fourth geometric shapes extends beyond the beyond the die mount area 306, protruding through corners of the die mount area 306 forming a recess relief region 312 of the recess 308.

The recess relief region 312 is used to release excess matter including gasses, vapors, or adhesive material. The recess relief region 312 can include a vent-hole or outlet etching for containment of the excess matter. The opposite end of the fourth geometric shapes forms a flat side of the recess relief region 312 that is perpendicular to a diagonal line intersecting opposite corners of the die mount area 306. The cavities 310 are formed in the die paddle 302 having a shape of a parabolic segment that includes a parabolic shaped side and with a flat side perpendicular to an axis of symmetry of the parabola.

For illustrative purposes, each of the cavities 310 is shown protruding towards a corner of a perimeter of the component side 304 with the flat side of the cavities 310 parallel and facing the flat side of the recess relief region 312. Any number of the cavities 310 can be positioned and formed around the die mount area 306. For example, the perimeter of the die mount area 306 can be surrounded by rows of the cavities 310 that protrude towards the perimeter of the component side 304.

The flat side of the cavities 310 is separated from the recess relief region 312 of the recess 308 by a component side strip 314. The component side strip 314 is formed from a section of the component side 304 and separates each of the cavities 310 from the recess relief region 312. The component side strip 314 can be used to separate material within the cavities 310 from material within the recess relief region 312, limit a flow of material within the cavities 310 into the recess relief region 312, or limit a flow of material within the recess relief region 312 into the cavities 310. The component side strip 314 can include a bridge, wall, or divider structure formed from the material of the die paddle 302.

A portion of the component side 304 exposes and surrounds the first geometric shape. Portions of the component side 304 are exposed on areas outside a perimeter of the first geometric shape between the second geometric shapes and the third geometric shapes.

Further portions of the component side 304 and the component side strip 314 are exposed from and surround the recess 308. The recess 308 has an area that is between sixty percent and ninety percent of an area of the die mount area 306. For example, the area of the recess 308 can be between seventy percent and seventy-five percent of the area of the die mount area 306.

Figure 4:
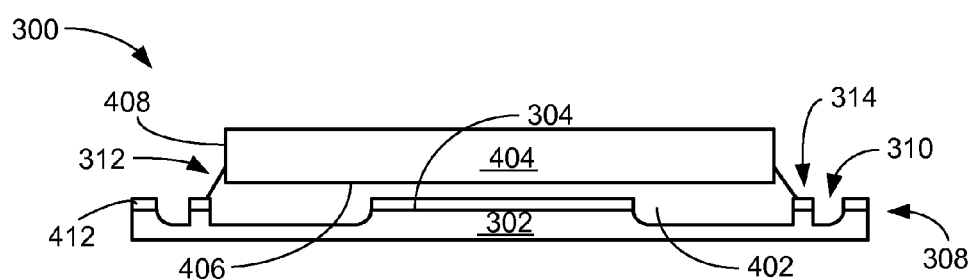
FIG. 4 is a cross-sectional view of FIG. 3 taken along line 4-4.

Referring now to FIG. 4, therein is shown a cross-sectional view of FIG. 3 taken along line 4-4. An adhesive 402 is applied in the recess 308 and on the die mount area 306. The adhesive 402 can cover all or portions of internal sides of the recess 308 in a covering process. The covering process can include cleaning, injecting, or heating processes.

An integrated circuit device 404 is attached directly on the adhesive 402 with the adhesive 402 covering an inactive side 406 of the integrated circuit device 404 using an attachment process. The inactive side 406 refers to a side of the integrated circuit device 404 not having active circuitry fabricated thereon or elements for connection to the active circuitry within the integrated circuit device 404. The attachment process can include positioning, heating, cooling, or mechanical clamping processes.

The adhesive 402 between the integrated circuit device 404 and the die paddle 302 is used to prevents movement of the integrated circuit device 404, protect the inactive side 406, or improve thermal transfer characteristics between the integrated circuit device 404 and the die paddle 302. The adhesive 402 can include a die attach material, a glue, an epoxy, or a thermally conductive adhesive material.

For illustrative purposes, the integrated circuit device 404 is shown having a length similar to the length of a perimeter of the die mount area 306 of FIG. 3. The length and width of the integrated circuit device 404 is less that a width and length of a perimeter of the recess 308.

The integrated circuit device 404 can have different lengths or widths. For example, the integrated circuit device 404 can have a perimeter with a width and a length greater than or equal to a width and length of a perimeter of the recess 308.

The adhesive 402 can cover all or a portion of a device side 408 of the integrated circuit device 404. The die paddle 302 is shown having a surface layer 412 such as one or more of the surface treatments. The surface layer 412 can be optionally applied on the component side 304 surrounding the recess 308.

The surface layer 412 can be applied anytime before or during the attachment process. The recess relief region 312 exposed outside the perimeter of the die mount area 306 provides a vent or outgassing outlet for the adhesive 402 to prevent entrapment of gas or void formations between the inactive side 406 and the recess 308.

The component side strip 314 separates vented or out-gassed material from the adhesive 402 within the recess relief region 312 from entering the cavities 310. The cavities 310 provide an opening that is optionally filled with an encapsulation (not shown) to provide a locking feature between the encapsulation and the die paddle 302.

It has been discovered that the recess relief region 312 reduces internal stress between the die paddle 302, the adhesive 402, and the integrated circuit device 404 by providing an out-gassing outlet to expel any gas, excess of the adhesive 402, or formation of voids.

It has also been discovered that the cavities 310 improves the structural integrity between the die paddle 302 and an encapsulation by providing openings and additional surface area in the die paddle 302 for enhanced interlocking or adhesion with the encapsulation.

It has further been discovered that the cavities 310 can be formed to surround the die mount area 306 to significantly enhance the extended locking feature of encapsulation to the die paddle 302, provide enhanced hermetic sealing of the integrated circuit device 404, or enhance package reliability by increased protection from impact or vibration induced failures.

It has yet further been discovered that any combination of the recess 308, the recess relief region 312, or the cavities 310 with bare surfaces increase the adhesion between the die paddle 302 and the integrated circuit device 404 or encapsulation by eliminating any occurrence of de-lamination of the adhesive 402 or the encapsulation.

Figure 5:
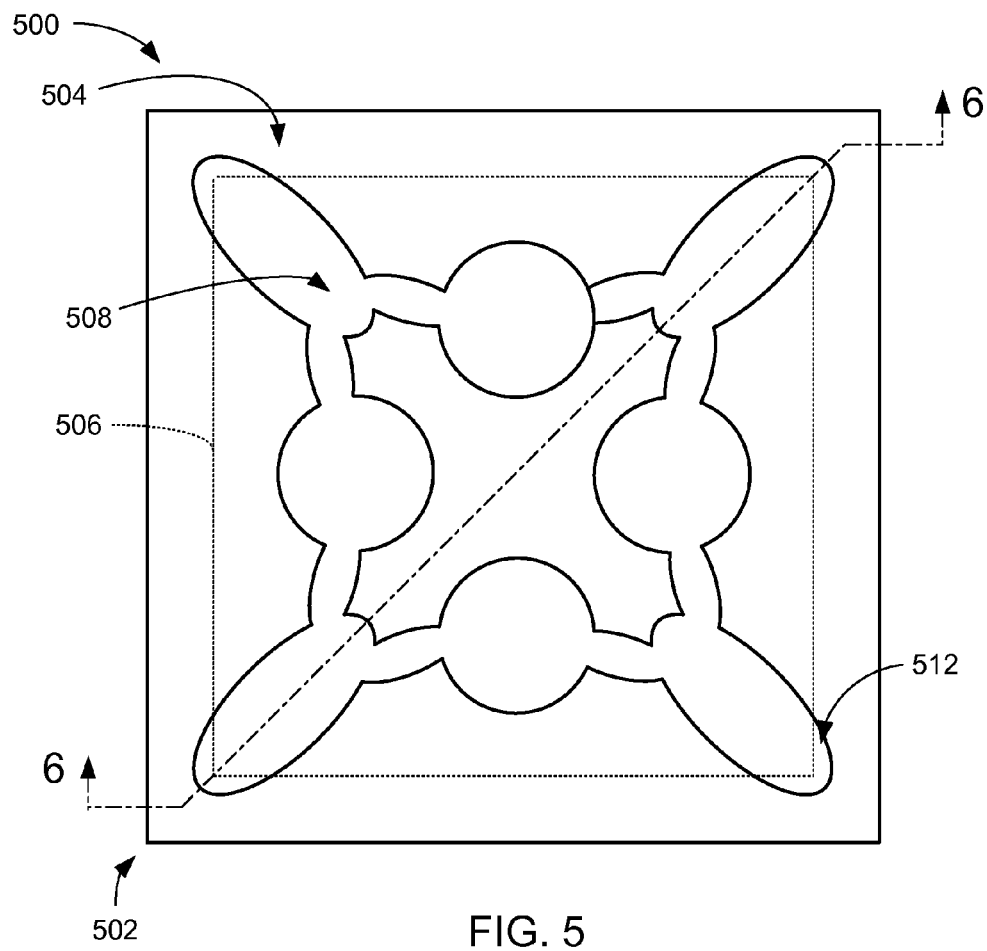
FIG. 5 is a top view of an integrated circuit mounting system in a third embodiment of the present invention.

Referring now to FIG. 5, therein is shown a top view of an integrated circuit mounting system 500 in a third embodiment of the present invention.

The integrated circuit mounting system 500 includes a die paddle 502 with a component side 504 and a die mount area 506 (shown with dotted lines) of the component side 504. The die mount area 506 represents a specific location and orientation on the die paddle 502 of a component (not shown) having circuitry.

The die paddle 502 provides a support structure for the component having circuitry, thermal dissipation for the component, a ground plane for the component, an electromagnetic shielding for the circuitry of the component, or a common electrical connect potential for a ground, a power, or an electrical signal. The die paddle 502 can be formed of a conductive material that can include copper or copper alloy and can optionally include surface treatments such as a pre-plated film (ppF) or silver (Ag) although it is understood a surface of the die paddle 502 can be bare.

The die paddle 502 includes one or more of a recess 508 formed in the die paddle 502 within and protruding from the die mount area 506 using a forming process that can include a stamping process, a laser forming process, an etching process, a grinding process, a routing process, or a mechanized process method. An interior of the recess 508 can optionally include surface treatments such as a pre-plated film (ppF) or silver (Ag) although it is understood surfaces of the recess 508 can be bare.

The recess 508 is formed having a combination of more than one geometric shapes such as lines, curves, or combinations thereof. For example, the recess 508 can have a shape of a knot and loop etching design.

The recess 508 includes first geometric shapes, second geometric shapes, and third geometric shapes. Each of the first geometric shapes has a shape of an ellipse and is positioned around a central region of the die mount area 506. The first geometric shapes are located directly along a horizontal line or vertical line intersecting the central region and coplanar with the component side 504. One of the first geometric shapes is located on the horizontal line between the central region and a first side of the die mount area 506.

Another of the first geometric shapes is located on the horizontal line between the central region and a second side opposite the first side of the geometric shapes. Yet another of the first geometric shapes is located on the vertical line between the central region and third side of the geometric shapes. Yet another of the first geometric shapes is located on the vertical line between the central region and a fourth side of the geometric shapes.

Each of the second geometric shapes has a shape of a partial ellipse. An end of each of the second geometric shapes is overlaps and is integral with a perimeter portion of the each of the first geometric shapes.

An opposite end of pairs of each of the second geometric shapes overlaps and is integral with one of the third geometric shapes. Each of the third geometric shapes has a shape of an ellipse. An end of each of the third geometric shapes opposite an end of the third geometric shapes integral with the pairs of each of the second geometric shapes aligns with and extends through corners of the die mount area 506 forming a recess relief region 512 of the recess 508. The recess relief region 512 is used to release excess matter including gasses, vapors, or adhesive material. The third geometric shapes are aligned along radial lines intersecting the central region and each of the corners of the die mount area 506.

Portions of the component side 504 expose and surround the recess 508. Also, a central portion of the component side 504 is exposed and enclosed by the recess 508. The recess 508 has an area that is between sixty percent and ninety percent of an area of the die mount area 506. For example, the area of the recess 508 can be between seventy percent and seventy-five percent of the area of the die mount area 506.

Figure 6:
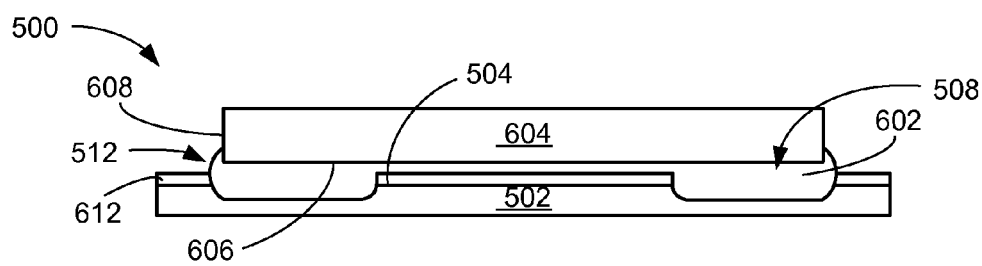
FIG. 6 is a cross-sectional view of FIG. 5 taken along line 6-6.

Referring now to FIG. 6, therein is shown a cross-sectional view of FIG. 5 taken along line 6-6. An adhesive 602 is applied in the recess 508 and on the die mount area 506. The adhesive 602 can cover all or portions of internal sides of the recess 508 in a covering process. The covering process can include cleaning, injecting, or heating processes.

An integrated circuit device 604 is attached directly on the adhesive 602 with the adhesive 602 covering an inactive side 606 of the integrated circuit device 604 using an attachment process. The inactive side 606 refers to a side of the integrated circuit device 604 not having active circuitry fabricated thereon or elements for connection to the active circuitry within the integrated circuit device 604. The attachment process can include positioning, heating, cooling, or mechanical clamping processes.

The adhesive 602 between the integrated circuit device 604 and the die paddle 502 is used to prevents movement of the integrated circuit device 604, protect the inactive side 606, or improve thermal transfer characteristics between the integrated circuit device 604 and the die paddle 502. The adhesive 602 can include a die attach material, a glue, an epoxy, or a thermally conductive adhesive material.

For illustrative purposes, the integrated circuit device 604 is shown having a length similar to the length of a perimeter of the die mount area 506 of FIG. 5. The length and width of the integrated circuit device 604 is less that a width and length of a perimeter of the recess 508.

The integrated circuit device 604 can have different lengths or widths. For example, the integrated circuit device 604 can have a perimeter with a width and a length greater than or equal to a width and length of a perimeter of the recess 508.

The adhesive 602 can cover all or a portion of a device side 608 of the integrated circuit device 604. The die paddle 502 is shown having a surface layer 612 such as one or more of the surface treatments. The surface layer 612 can be optionally applied on the component side 504 surrounding the recess 508.

The surface layer 612 can be applied anytime before or during the attachment process. The recess relief region 512 exposed outside the perimeter of the die mount area 506 provides a vent or outgassing outlet for the adhesive 602 to prevent entrapment of gas or void formations between the inactive side 606 and the recess 508.

It has been discovered that the recess 508 and the recess relief region 512 increases the adhesive strength between the die paddle 502 and the integrated circuit device 604 by providing the adhesive 602 with increased surface area and robustness from shear stress resulting in reductions in manufacturing defects and rework processing.

It has also been discovered that the recess 508 with the adhesive 602 and the recess relief region 512 prevents the die paddle 502 from detachment from the integrated circuit device 604 resulting in improved product yields or product reliability.

It has further been discovered that the recess 508 provides both enhanced locking of the adhesive 602 between the integrated circuit device 604 and the die paddle 502 and a capability for the die paddle 502 to be formed with a thickness less than a thickness of typical leadframe die paddles resulting in lower profile or lighter packages.

It has yet further been discovered that by having the recess 508 and the recess relief region 512 with bare surfaces significantly increases the adhesive bond between the die paddle 502 and the integrated circuit device 604 by eliminating any occurrence of de-lamination of the adhesive 602 from the die paddle 502.

Figure 7:
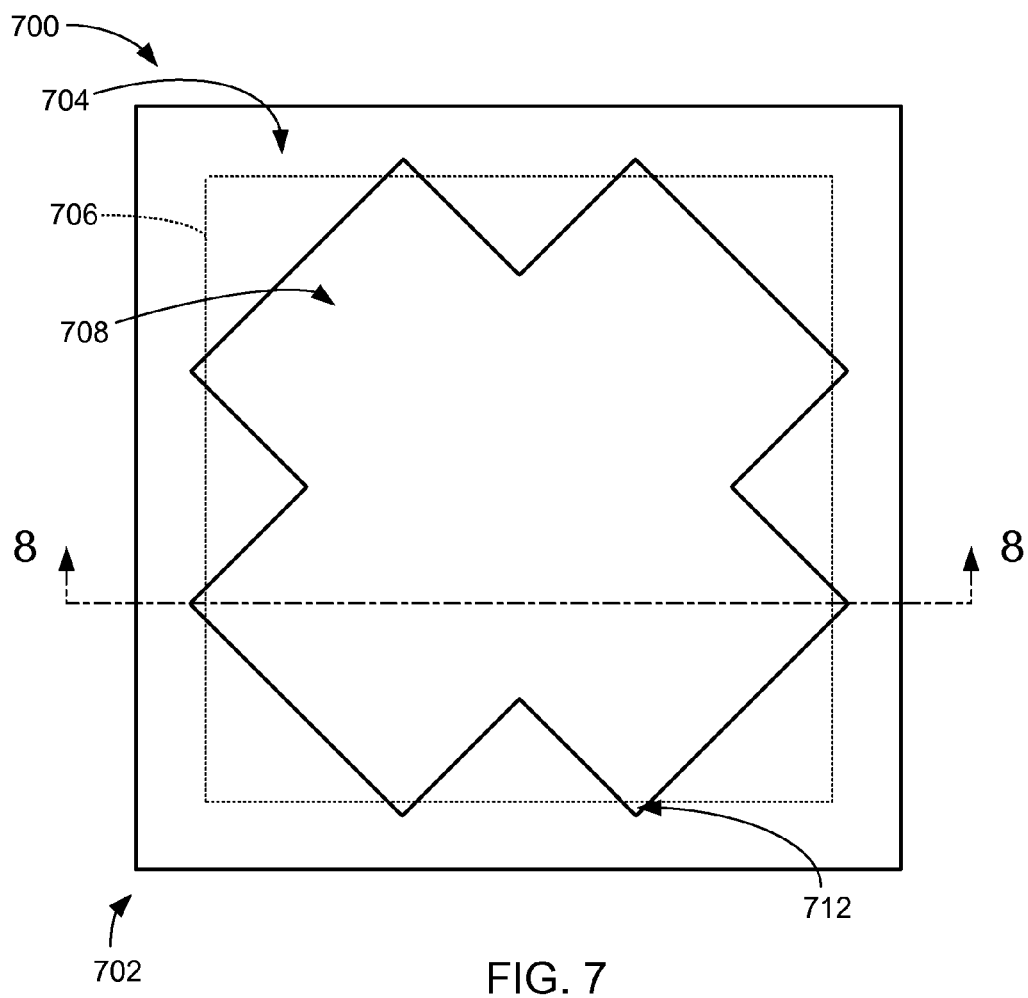
FIG. 7 is a top view of an integrated circuit mounting system in a fourth embodiment of the present invention.

Referring now to FIG. 7, therein is shown a top view of an integrated circuit mounting system 700 in a fourth embodiment of the present invention. The integrated circuit mounting system 700 includes a die paddle 702 with a component side 704 and a die mount area 706 (shown with dotted lines) of the component side 704. The die mount area 706 represents a specific location and orientation on the die paddle 702 of a component (not shown) having circuitry.

The die paddle 702 provides a support structure for the component having circuitry, thermal dissipation for the component, a ground plane for the component, an electromagnetic shielding for the circuitry of the component, or a common electrical connect potential for a ground, a power, or an electrical signal. The die paddle 702 can be formed of a conductive material that can include copper or copper alloy and optionally include surface treatments such as a pre-plated film (ppF) or silver (Ag) although it is understood a surface of the die paddle 702 can be bare.

The die paddle 702 includes one or more of a recess 708 formed in the die paddle 702 within and protruding from the die mount area 706 using a forming process that can include a stamping process, a laser forming process, an etching process, a grinding process, a routing process, or a mechanized process method. An interior of the recess 708 can optionally include surface treatments such as a pre-plated film (ppF) or silver (Ag) although it is understood surfaces of the recess 708 can be bare.

The recess 708 is formed having a combination of more than one geometric shapes such as lines, curves, or combinations thereof. For example, the recess 708 can have a shape of a leaning cross etching design.

The recess 708 includes a first geometric shape and a second geometric shape. The first geometric shape has a shape of a rectangle having length more than twice a width. The first geometric shape includes a central region positioned at a central region of the die mount area 706. One pair of opposing sides forming the width of the first geometric shape faces and extends towards a first pair opposing corners of the die mount area 706.

The second geometric shape has a shape of a rectangle similar to the shape of the first geometric shape. The second geometric shape includes a central region positioned at the central region of the die mount area 706. One pair of opposing sides forming a width of the second geometric shape faces and extends towards a second pair of opposing corners of the die mount area 706.

The first pair of the opposing corners of the die mount area 706 is rotationally offset about the central region of the die mount area 706 from the second pair of the opposing corners of the die mount area 706. The first pair of the opposing corners of the die mount area 706 has a rotational offset between forty-five degrees and one hundred thirty-five degrees relative to the second pair of the opposing corners of the die mount area 706.

Corners of the first geometric shape and of the second geometric shape protrude outside of a perimeter of the die mount area 706 forming a recess relief region 712 of the recess 708. The recess relief region 712 is used to release excess matter including gasses, vapors, or adhesive material. The first geometric shape and the second geometric shape overlap and are integral to one another to form the recess 708.

The component side 704 exposes and surrounds the recess 708. The recess 708 has an area that is between sixty percent and ninety percent of an area of the die mount area 706. For example, the area of the recess 708 can be between seventy percent and seventy-five percent of the area of the die mount area 706.

Figure 8:
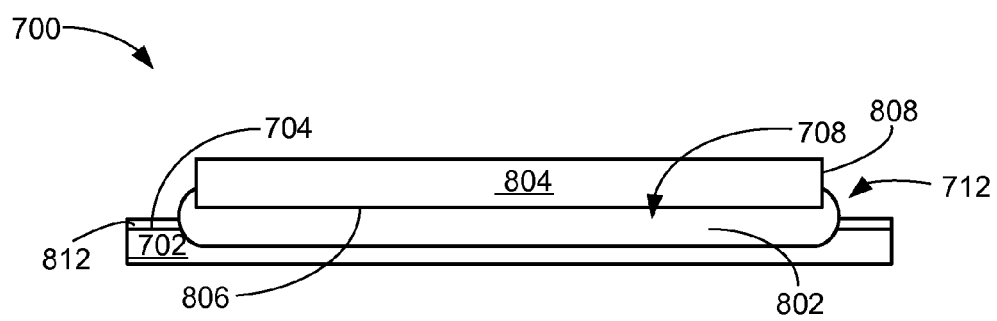
FIG. 8 is a cross-sectional view of FIG. 7 taken along line 8-8.

Referring now to FIG. 8, therein is shown a cross-sectional view of FIG. 7 taken along line 8-8. An adhesive 802 is applied in the recess 708 and on the die mount area 706. The adhesive 802 can cover all or portions of internal sides of the recess 708 in a covering process. The covering process can include cleaning, injecting, or heating processes.

An integrated circuit device 804 is attached directly on the adhesive 802 with the adhesive 802 covering an inactive side 806 of the integrated circuit device 804 using an attachment process. The inactive side 806 refers to a side of the integrated circuit device 804 not having active circuitry fabricated thereon or elements for connection to the active circuitry within the integrated circuit device 804. The attachment process can include positioning, heating, cooling, or mechanical clamping processes.

The adhesive 802 between the integrated circuit device 804 and the die paddle 702 is used to prevents movement of the integrated circuit device 804, protect the inactive side 806, or improve thermal transfer characteristics between the integrated circuit device 804 and the die paddle 702. The adhesive 802 can include a die attach material, a glue, an epoxy, or a thermally conductive adhesive material.

For illustrative purposes, the integrated circuit device 804 is shown having a length similar to the length of a perimeter of the die mount area 706 of FIG. 7. The length and width of the integrated circuit device 804 is less that a width and length of a perimeter of the recess 708.

The integrated circuit device 804 can have different lengths or widths. For example, the integrated circuit device 804 can have a perimeter with a width and a length greater than or equal to a width and length of a perimeter of the recess 708.

The adhesive 802 can cover all or a portion of a device side 808 of the integrated circuit device 804. The die paddle 702 is shown having a surface layer 812 such as one or more of the surface treatments. The surface layer 812 can be optionally applied on the component side 704 surrounding the recess 708.

The surface layer 812 can be applied anytime before or during the attachment process. The recess relief region 712 exposed outside the perimeter of the die mount area 706 provides a vent or outgassing outlet for the adhesive 802 to prevent entrapment of gas or void formations between the inactive side 806 and the recess 708.

Figure 9:
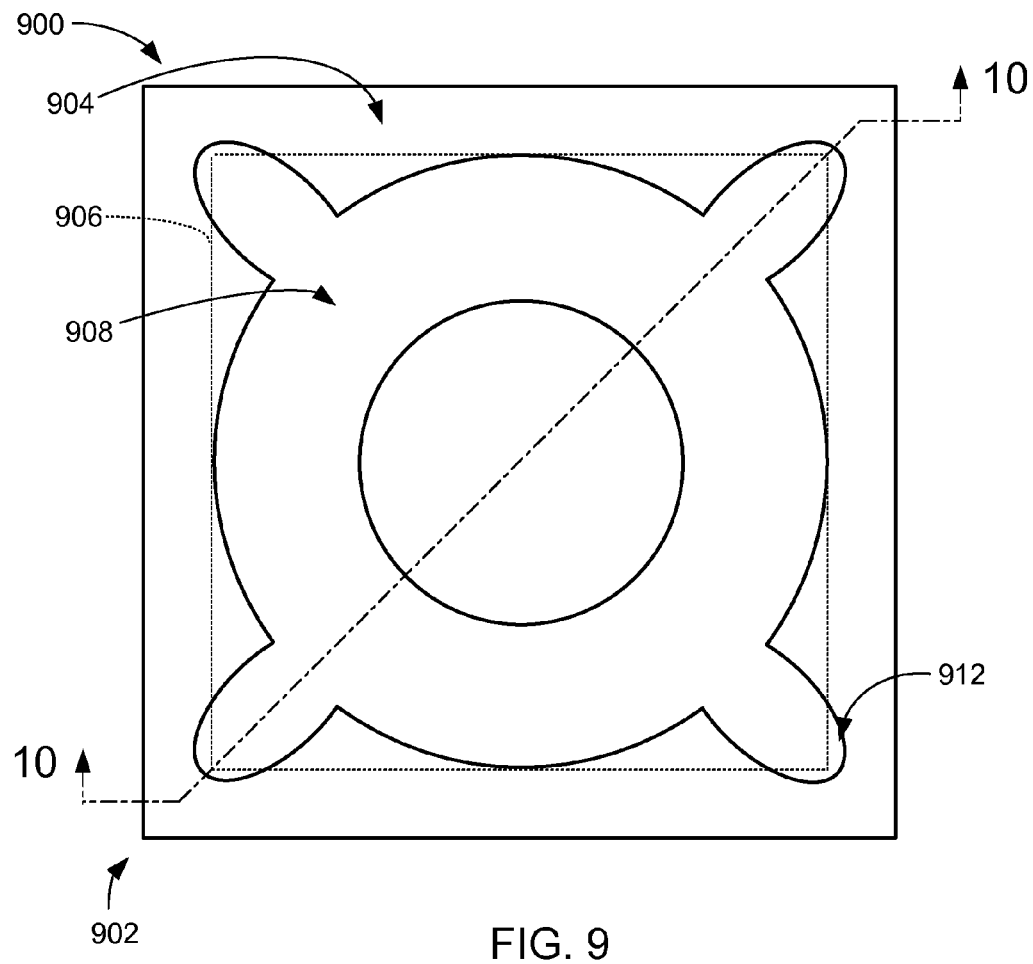
FIG. 9 is a top view of an integrated circuit mounting system in a fifth embodiment of the present invention.

Referring now to FIG. 9, therein is shown a top view of an integrated circuit mounting system 900 in a fifth embodiment of the present invention. The integrated circuit mounting system 900 includes a die paddle 902 with a component side 904 and a die mount area 906 (shown with dotted lines) of the component side 904. The die mount area 906 represents a specific location and orientation on the die paddle 902 of a component (not shown) having circuitry.

The die paddle 902 provides a support structure for the component having circuitry, thermal dissipation for the component, a ground plane for the component, an electromagnetic shielding for the circuitry of the component, or a common electrical connect potential for a ground, a power, or an electrical signal. The die paddle 902 can be formed of a conductive material that can include copper or copper alloy and can optionally include surface treatments such as a pre-plated film (ppF) or silver (Ag) although it is understood a surface of the die paddle 902 can be bare.

The die paddle 902 includes one or more of a recess 908 formed in the die paddle 902 within and protruding from the die mount area 906 using a forming process that can include a stamping process, a laser forming process, an etching process, a grinding process, a routing process, or a mechanized process method. An interior of the recess 908 can optionally include surface treatments such as a pre-plated film (ppF) or silver (Ag) although it is understood surfaces of the recess 908 can be bare.

The recess 908 is formed having a combination of more than one geometric shapes such as lines, curves, or combinations thereof. For example, the recess 908 can have a shape of a sailor's wheel etching design.

The recess 908 includes a first geometric shape and second geometric shapes. The first geometric shape has a shape of a toroid having an outer side and an inner side with shapes of an ellipse. A central axis of the inner side of the first geometric shape perpendicular to the component side 904 and sides of the first geometric shape intersects a central region of the die mount area 906. Portions of the outer side intersect a central portion of sides of the die mount area 906.

Each of the second geometric shapes are elliptical in shape with curved sides joining an end of the second geometric shapes and an opposite end of the second geometric shapes. The end of each of the second geometric shapes is integral with the outer side of the first geometric shape. The opposite end of each of the second geometric shapes extends from the end of the second geometric shapes through corners of the die mount area 906 forming a recess relief region 912 of the recess 908. The recess relief region 912 is used to release excess matter including gasses, vapors, or adhesive material.

The opposite end of each of the second geometric shapes protrudes outside of a perimeter of the die mount area 906. The first geometric shape and the second geometric shapes overlap and are integral to one another to form the recess 908.

Portions of the component side 904 expose and surround the recess 908. Also, portions of the component side 904 are exposed from and surrounded by the inner side of the first geometric shape. The recess 908 has an area that is between sixty percent and ninety percent of an area of the die mount area 906. For example, the area of the recess 908 can be between seventy percent and seventy-five percent of the area of the die mount area 906.

Figure 10:
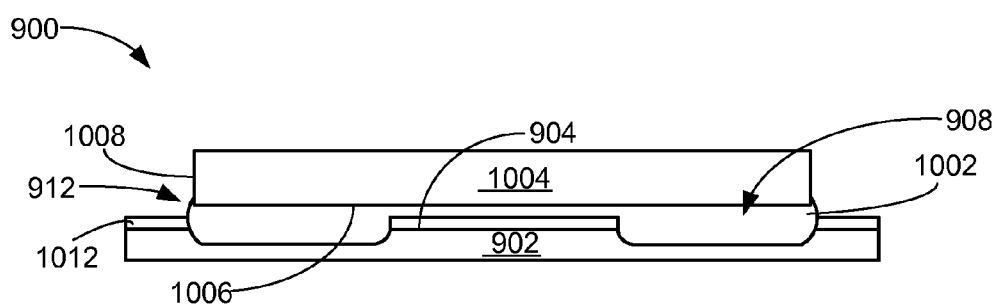
FIG. 10 is a cross-sectional view of FIG. 9 taken along line 10-10.

Referring now to FIG. 10, therein is shown a cross-sectional view of FIG. 9 taken along line 10-10. An adhesive 1002 is applied in the recess 908 and on the die mount area 906. The adhesive 1002 can cover all or portions of internal sides of the recess 908 in a covering process. The covering process can include cleaning, injecting, or heating processes.

An integrated circuit device 1004 is attached directly on the adhesive 1002 with the adhesive 1002 covering an inactive side 1006 of the integrated circuit device 1004 using an attachment process. The inactive side 1006 refers to a side of the integrated circuit device 1004 not having active circuitry fabricated thereon or elements for connection to the active circuitry within the integrated circuit device 1004. The attachment process can include positioning, heating, cooling, or mechanical clamping processes.

The adhesive 1002 between the integrated circuit device 1004 and the die paddle 902 is used to prevents movement of the integrated circuit device 1004, protect the inactive side 1006, or improve thermal transfer characteristics between the integrated circuit device 1004 and the die paddle 902. The adhesive 1002 can include a die attach material, a glue, an epoxy, or a thermally conductive adhesive material.

For illustrative purposes, the integrated circuit device 1004 is shown having a length similar to the length of a perimeter of the die mount area 906 of FIG. 9. The length and width of the integrated circuit device 1004 is less that a width and length of a perimeter of the recess 908.

The integrated circuit device 1004 can have different lengths or widths. For example, the integrated circuit device 1004 can have a perimeter with a width and a length greater than or equal to a width and length of a perimeter of the recess 908.

The adhesive 1002 can cover all or a portion of a device side 1008 of the integrated circuit device 1004. The die paddle 902 is shown having a surface layer 1012 such as one or more of the surface treatments. The surface layer 1012 can be optionally applied on the component side 904 surrounding the recess 908.

The surface layer 1012 can be applied anytime before or during the attachment process. The recess relief region 912 exposed outside the perimeter of the die mount area 906 provides a vent or outgassing outlet for the adhesive 1002 to prevent entrapment of gas or void formations between the inactive side 1006 and the recess 908.

Figure 11:
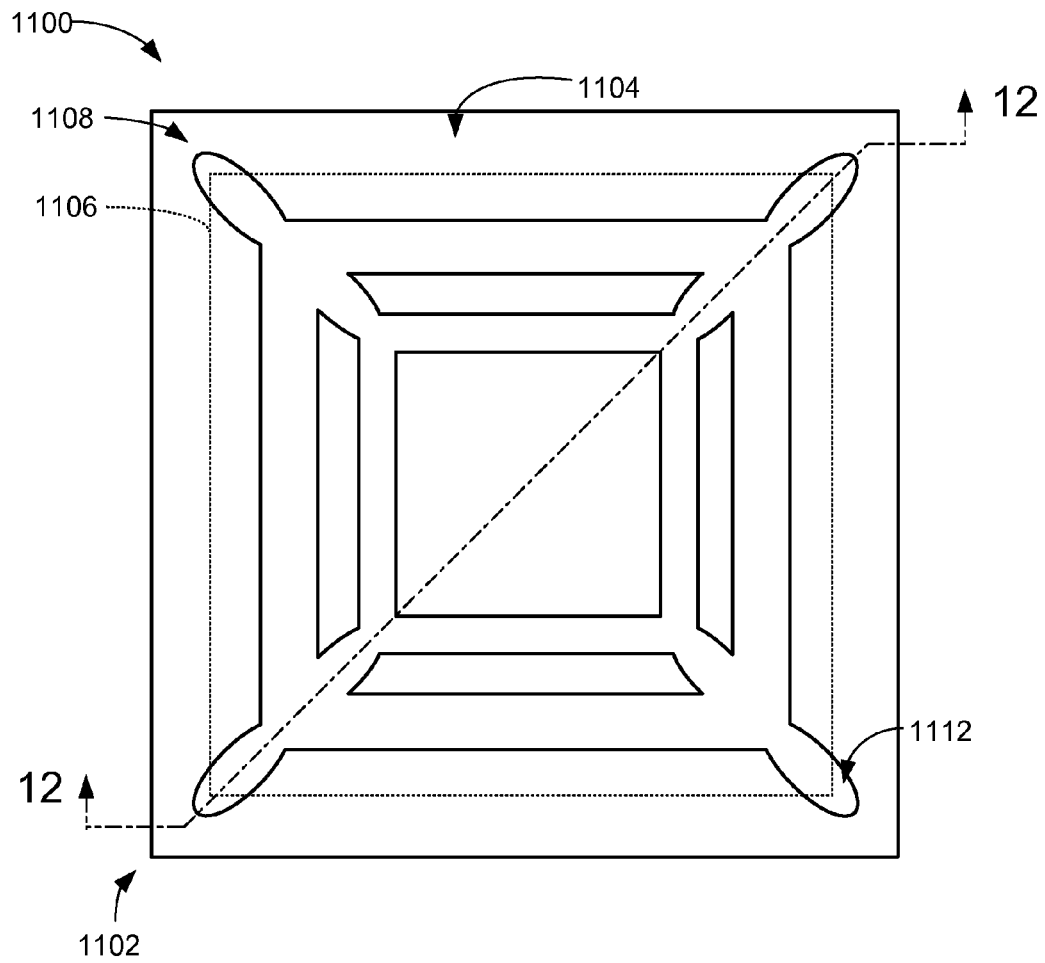
FIG. 11 is a top view of an integrated circuit mounting system in a sixth embodiment of the present invention.

Referring now to FIG. 11, therein is shown a top view of an integrated circuit mounting system 1100 in a sixth embodiment of the present invention. The integrated circuit mounting system 1100 includes a die paddle 1102 with a component side 1104 and a die mount area 1106 (shown with dotted lines) of the component side 1104. The die mount area 1106 represents a specific location and orientation on the die paddle 1102 of a component (not shown) having circuitry.

The die paddle 1102 provides a support structure for the component having circuitry, thermal dissipation for the component, a ground plane for the component, an electromagnetic shielding for the circuitry of the component, or a common electrical connect potential for a ground, a power, or an electrical signal. The die paddle 1102 can be formed of a conductive material that can include copper or copper alloy and can optionally include surface treatments such as a pre-plated film (ppF) or silver (Ag) although it is understood a surface of the die paddle 1102 can be bare.

The die paddle 1102 includes one or more of a recess 1108 formed in the die paddle 1102 within and protruding from the die mount area 1106 using a forming process that can include a stamping process, a laser forming process, an etching process, a grinding process, a routing process, or a mechanized process method. An interior of the recess 1108 can optionally include surface treatments such as a pre-plated film (ppF) or silver (Ag) although it is understood surfaces of the recess 1108 can be bare.

The recess 1108 is formed having a combination of more than one geometric shapes such as lines, curves, or combinations thereof. For example, the recess 1108 can have a shape of an extended concentric square etching design.

The recess 1108 includes a first geometric shape, a second geometric shape, third geometric shapes and fourth geometric shapes. The first geometric shape has a shape of a rectangular frame positioned within the second geometric shape. The second geometric shape is similar to the first geometric shape and has a length and width proportionally larger than a length and width of the first geometric shape. The second geometric shape surrounds a perimeter formed by the first geometric shape.

Sides of the first geometric shape are parallel to sides of the second geometric shape. Perimeter centers of the first geometric shape and of the second geometric shape are coincident with a center region of the die mount area 1106.

Each of the third geometric shapes are elliptical in shape with curved sides joining an end of the third geometric shapes and an opposite end of the third geometric shapes. The end of each of the third geometric shapes is integral with a corner of the first geometric shape on the perimeter of the first geometric shape. The opposite end of each of the third geometric shapes is integral with a corner of the second geometric shape inside a perimeter of the second geometric shape.

The fourth geometric shapes each have curved sides joining an end of the fourth geometric shapes and an opposite end of the fourth geometric shapes similar to the third geometric shapes with the curved sides, the end, and the opposite end, respectively. The end of each of the fourth geometric shapes is integral with a corner of the second geometric shape on a perimeter of the second geometric shape.

The opposite end of the fourth geometric shapes protrudes towards a corner of a perimeter of the die paddle 1102. The opposite end of the fourth geometric shapes extends beyond the beyond the die mount area 1106, protruding thru corners of the die mount area 1106 forming a recess relief region 1112 of the recess 1108. The recess relief region 1112 is used to release excess matter including gasses, vapors, or adhesive material.

A portion of the component side 1104 exposes and surrounds the first geometric shape. Portions of the component side 1104 are exposed on areas outside a perimeter of the first geometric shape between the second geometric shapes and the third geometric shapes.

Further portions of the component side 1104 are exposed from and surround the recess 1108. The recess 1108 has an area that is between sixty percent and ninety percent of an area of the die mount area 1106. For example, the area of the recess 1108 can be between seventy percent and seventy-five percent of the area of the die mount area 1106.

Figure 12:
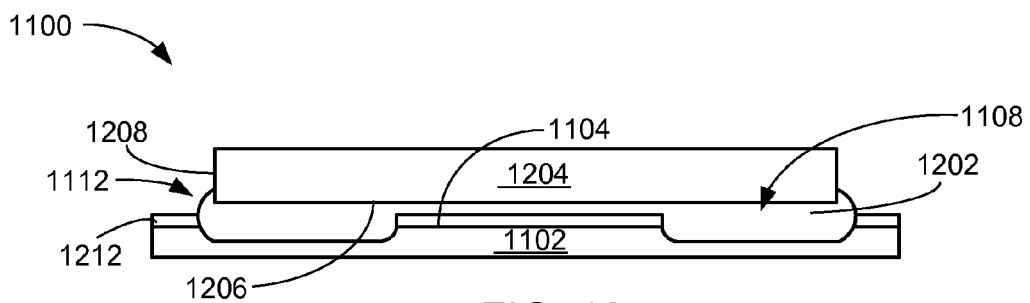
FIG. 12 is a cross-sectional view of FIG. 11 taken along line 12-12.

Referring now to FIG. 12, therein is shown a cross-sectional view of FIG. 11 taken along line 12-12. An adhesive 1202 is applied in the recess 1108 and on the die mount area 1106. The adhesive 1202 can cover all or portions of internal sides of the recess 1108 in a covering process. The covering process can include cleaning, injecting, or heating processes.

An integrated circuit device 1204 is attached directly on the adhesive 1202 with the adhesive 1202 covering an inactive side 1206 of the integrated circuit device 1204 using an attachment process. The inactive side 1206 refers to a side of the integrated circuit device 1204 not having active circuitry fabricated thereon or elements for connection to the active circuitry within the integrated circuit device 1204. The attachment process can include positioning, heating, cooling, or mechanical clamping processes.

The adhesive 1202 between the integrated circuit device 1204 and the die paddle 1102 is used to prevents movement of the integrated circuit device 1204, protect the inactive side 1206, or improve thermal transfer characteristics between the integrated circuit device 1204 and the die paddle 1102. The adhesive 1202 can include a die attach material, a glue, an epoxy, or a thermally conductive adhesive material.

For illustrative purposes, the integrated circuit device 1204 is shown having a length similar to a length of a perimeter of the die mount area 1106 of FIG. 11. The length and width of the integrated circuit device 1204 is less that a width and length of a perimeter of the recess 1108. The integrated circuit device 1204 can have different lengths or widths.

The integrated circuit device 1204 can have a perimeter with a width and a length greater than or equal to a width and length of a perimeter of the recess 1108.

The adhesive 1202 can cover all or a portion of a device side 1208 of the integrated circuit device 1204. The die paddle 1102 is shown having a surface layer 1212 such as one or more of the surface treatments. The surface layer can optionally be applied on the component side 1104 surrounding the recess 1108.

The surface layer 1212 can be applied anytime before or during the attachment process. The recess relief region 1112 exposed outside the perimeter of the die mount area 1106 provides a vent or outgassing outlet for the adhesive 1202 to prevent entrapment of gas or void formations between the inactive side 1206 and the recess 1108.

Figure 13:
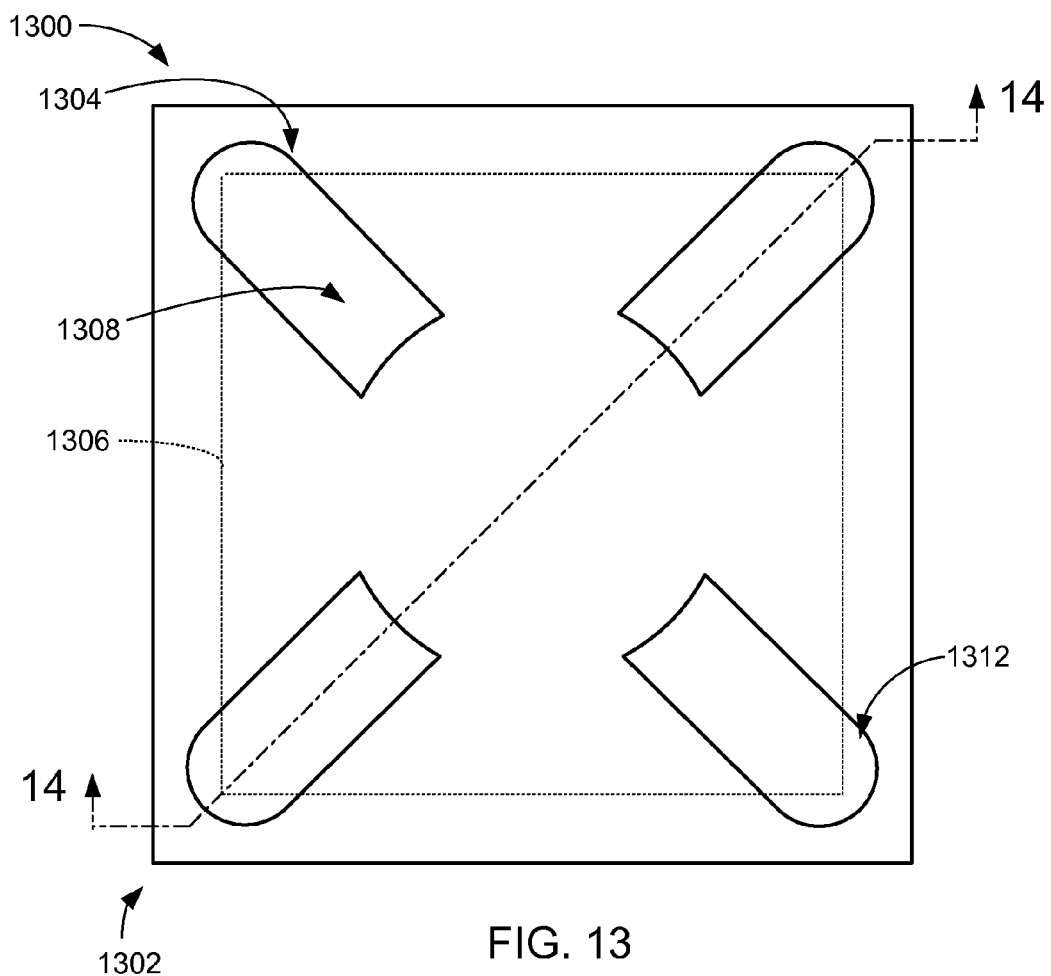
FIG. 13 is a top view of an integrated circuit mounting system in a seventh embodiment of the present invention.

Referring now to FIG. 13, therein is shown a top view of an integrated circuit mounting system 1300 in a seventh embodiment of the present invention. The integrated circuit mounting system 1300 includes a die paddle 1302 with a component side 1304 and a die mount area 1306 (shown with dotted lines) of the component side 1304. The die mount area 1306 represents a specific location and orientation on the die paddle 1302 of a component (not shown) having circuitry.

The die paddle 1302 provides a support structure for the component having circuitry, thermal dissipation for the component, a ground plane for the component, an electromagnetic shielding for the circuitry of the component, or a common electrical connect potential for a ground, a power, or an electrical signal. The die paddle 1302 can be formed of a conductive material that can include copper or copper alloy and can optionally include surface treatments such as a pre-plated film (ppF) or silver (Ag) although it is understood a surface of the die paddle 1302 can be bare.

The die paddle 1302 includes one or more of a recess 1308 formed in the die paddle 1302 within and protruding from the die mount area 1306 using a forming process that can include a stamping process, a laser forming process, an etching process, a grinding process, a routing process, or a mechanized process method. An interior of the recess 1308 can optionally include surface treatments such as a pre-plated film (ppF) or silver (Ag) although it is understood surfaces of the recess 1308 can be bare.

The recess 1308 is formed having a combination of more than one geometric shapes such as lines, curves, or combinations thereof. For example, the recess 1308 can have a shape of a four corner slot etching design.

The recess 1308 includes geometric shapes having a shape similar to a shape of a rod. The geometric shapes each include a first end and a second end opposite the first end. Each of the geometric shapes have a length at least three times a width of the geometric shapes. The geometric shapes are located on diagonal lines that intersect opposite corners of the die mount area 1306.

The first end of each of the geometric shapes has a concave shaped surface. The first end of each of the geometric shapes is on one of the diagonal lines midway between one of the corners and a point of intersection of the diagonal lines. The second end of each of the geometric shapes has a convex shaped surface. A portion of the second end of each of the geometric shapes overlaps and extends beyond a corner of the die mount area 1306.

The portion of second end of each of the geometric shapes extending beyond the die mount area 1306 is referred to as a recess relief region 1312. The recess relief region 1312 is used to release excess matter including gasses, vapors, or adhesive material.

Portions of the component side 1304 expose and surround the geometric shapes that form the recess 1308. The recess 1308 has an area that is between sixty percent and ninety percent of an area of the die mount area 1306. For example, the area of the recess 1308 can be between seventy percent and seventy-five percent of the area of the die mount area 1306.

Figure 14:
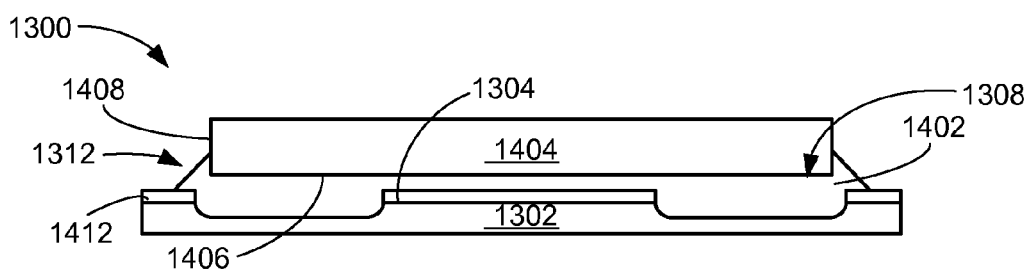
FIG. 14 is a cross-sectional view of FIG. 13 taken along line 14-14.

Referring now to FIG. 14, therein is shown a cross-sectional view of FIG. 13 taken along line 14-14. An adhesive 1402 is applied in the recess 1308 and on the die mount area 1306. The adhesive 1402 can cover all or portions of internal sides of the recess 1308 in a covering process. The covering process can include cleaning, injecting, or heating processes.

An integrated circuit device 1404 is attached directly on the adhesive 1402 with the adhesive 1402 covering an inactive side 1406 of the integrated circuit device 1404 using an attachment process. The inactive side 1406 refers to a side of the integrated circuit device 1404 not having active circuitry fabricated thereon or elements for connection to the active circuitry within the integrated circuit device 1404. The attachment process can include positioning, heating, cooling, or mechanical clamping processes.

The adhesive 1402 between the integrated circuit device 1404 and the die paddle 1302 is used to prevents movement of the integrated circuit device 1404, protect the inactive side 1406, or improve thermal transfer characteristics between the integrated circuit device 1404 and the die paddle 1302. The adhesive 1402 can include a die attach material, a glue, an epoxy, or a thermally conductive adhesive material.

For illustrative purposes, the integrated circuit device 1404 is shown having a length similar to the length of a perimeter of the die mount area 1306 of FIG. 13. The length and width of the integrated circuit device 1404 is less that a width and length of a perimeter of the recess 1308.

The integrated circuit device 1404 can have different lengths or widths. For example, the integrated circuit device 1404 can have a perimeter with a width and a length greater than or equal to a width and length of a perimeter of the recess 1308.

The adhesive 1402 can cover all or a portion of a device side 1408 of the integrated circuit device 1404. The die paddle 1302 is shown having a surface layer 1412 such as one or more of the surface treatments. The surface layer 1412 can be optionally applied on the component side 1304 surrounding the recess 1308.

The surface layer 1412 can be applied anytime before or during the attachment process. The recess relief region 1312 exposed outside the perimeter of the die mount area 1306 provides a vent or outgassing outlet for the adhesive 1402 to prevent entrapment of gas or void formations between the inactive side 1406 and the recess 1308.

Figure 15:
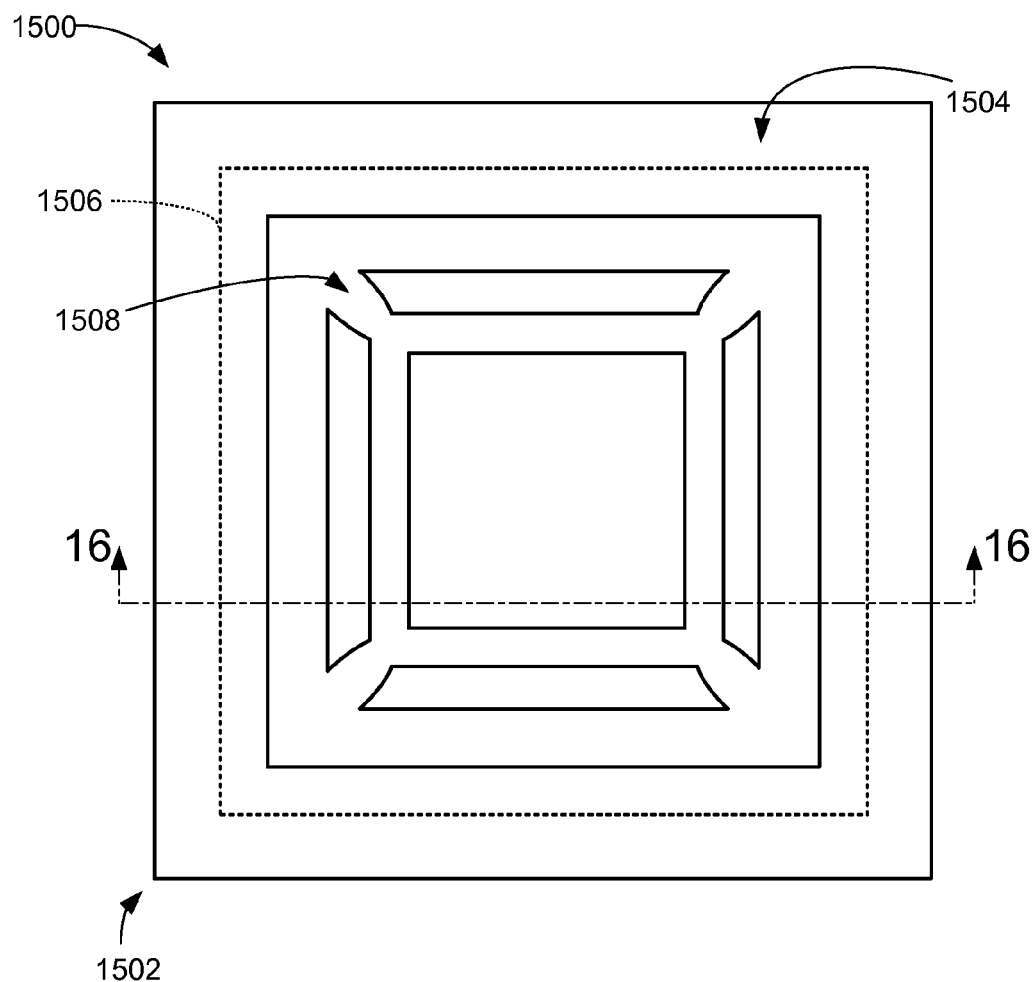
FIG. 15 is a top view of an integrated circuit mounting system in an eighth embodiment of the present invention.

Referring now to FIG. 15, therein is shown a top view of an integrated circuit mounting system 1500 in an eighth embodiment of the present invention. The integrated circuit mounting system 1500 includes a die paddle 1502 with a component side 1504 and a die mount area 1506 (shown with dotted lines) of the component side 1504. The die mount area 1506 represents a specific location and orientation on the die paddle 1502 of a component (not shown) having circuitry.

The die paddle 1502 provides a support structure for the component having circuitry, thermal dissipation for the component, a ground plane for the component, or an electromagnetic shielding for the circuitry of the component, or common electrical connect potential for a ground, a power, or an electrical signal. The die paddle 1502 can be formed of a conductive material that can include copper or copper alloy and can optionally include surface treatments such as a pre-plated film (ppF) or silver (Ag) although it is understood a surface of the die paddle 1502 can be bare.

The die paddle 1502 includes one or more of a recess 1508 formed in the die paddle 1502 within the die mount area 1506 using a forming process that can include a stamping process, a laser forming process, an etching process, a grinding process, a routing process, or a mechanized process method. An interior of the recess 1508 can optionally include surface treatments such as a pre-plated film (ppF) or silver (Ag) although it is understood surfaces of the recess 1508 can be bare.

The recess 1508 is formed having a combination of more than one geometric shapes, such as lines, curves, or combinations thereof. For example, the recess 1508 can have a shape of a concentric square etching design.

The recess 1508 includes a first geometric shape, a second geometric shape, and third geometric shapes. The first geometric shape has a shape of a rectangular frame positioned within the second geometric shape. The second geometric shape is similar to the first geometric shape and has a length and width proportionally larger than a length and width of the first geometric shape.

Sides of the first geometric shape are parallel to sides of the second geometric shape. Perimeter centers of the first geometric shape and of the second geometric shape are coincident with a center region of the die mount area 1506.

The third geometric shapes are elliptical in shape with each having curved sides joining an end of the third geometric shapes and an opposite end of the third geometric shapes. The end of each of the third geometric shapes is integral with a corner of the first geometric shape on a perimeter of the first geometric shape. The opposite end of each of the third geometric shapes is integral with a corner of the second geometric shape inside a perimeter of the first geometric shape.

A portion of the component side 1504 exposes and surrounds the first geometric shape. Portions of the component side 1504 are exposed on areas outside a perimeter of the first geometric shape between the second geometric shapes and the third geometric shapes.

Further portions of the component side 1504 are exposed from and surround the recess 1508. The recess 1508 has an area that is between sixty percent and ninety percent of an area of the die mount area 1506. For example, the area of the recess 1508 can be between seventy percent and seventy-five percent of the area of the die mount area 1506.

Figure 16:
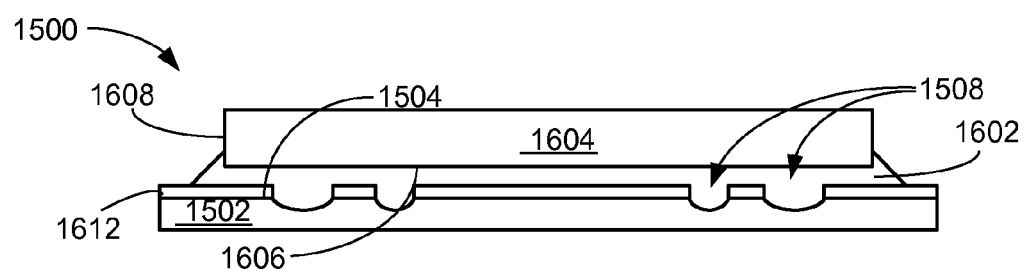
FIG. 16 is a cross-sectional view of FIG. 15 taken along line 16-16.

Referring now to FIG. 16, therein is shown a cross-sectional view of FIG. 15 taken along line 16-16. An adhesive 1602 is applied in the recess 1508 and on the die mount area 1506. The adhesive 1602 can cover all or portions of internal sides of the recess 1508 in a covering process. The covering process can include cleaning, injecting, or heating processes.

An integrated circuit device 1604 is attached directly on the adhesive 1602 with the adhesive 1602 covering an inactive side 1606 of the integrated circuit device 1604 using an attachment process. The inactive side 1606 refers to a side of the integrated circuit device 1604 not having active circuitry fabricated thereon or elements for connection to the active circuitry within the integrated circuit device 1604. The attachment process can include positioning, heating, cooling, or mechanical clamping processes.

The adhesive 1602 between the integrated circuit device 1604 and the die paddle 1502 is used to prevents movement of the integrated circuit device 1604, protect the inactive side 1606, or improve thermal transfer characteristics between the integrated circuit device 1604 and the die paddle 1502. The adhesive 1602 can include a die attach material, a glue, an epoxy, or a thermally conductive adhesive material.

For illustrative purposes, the integrated circuit device 1604 is shown having a length similar to the length of a perimeter of the die mount area 1506 of FIG. 15.

The integrated circuit device 1604 can have different lengths or widths. For example, the integrated circuit device 1604 can have a perimeter with a width and a length greater or less than a width and length of the perimeter of the recess 1508

The adhesive 1602 can cover all or a portion of a device side 1608 of the integrated circuit device 1604. The die paddle 1502 is shown having a surface layer 1612 such as one or more of the surface treatments. The surface layer 1612 can be optionally applied on the component side 1504 surrounding the recess 1508.

The surface layer 1612 can be applied anytime before or during the attachment process. Any portion of the recess 1508 exposed outside the perimeter of the die mount area 1506 provides a vent or outgassing outlet for the adhesive 1602 to prevent entrapment of gas or void formations between the inactive side 1606 and the recess 1508.

Figure 17:
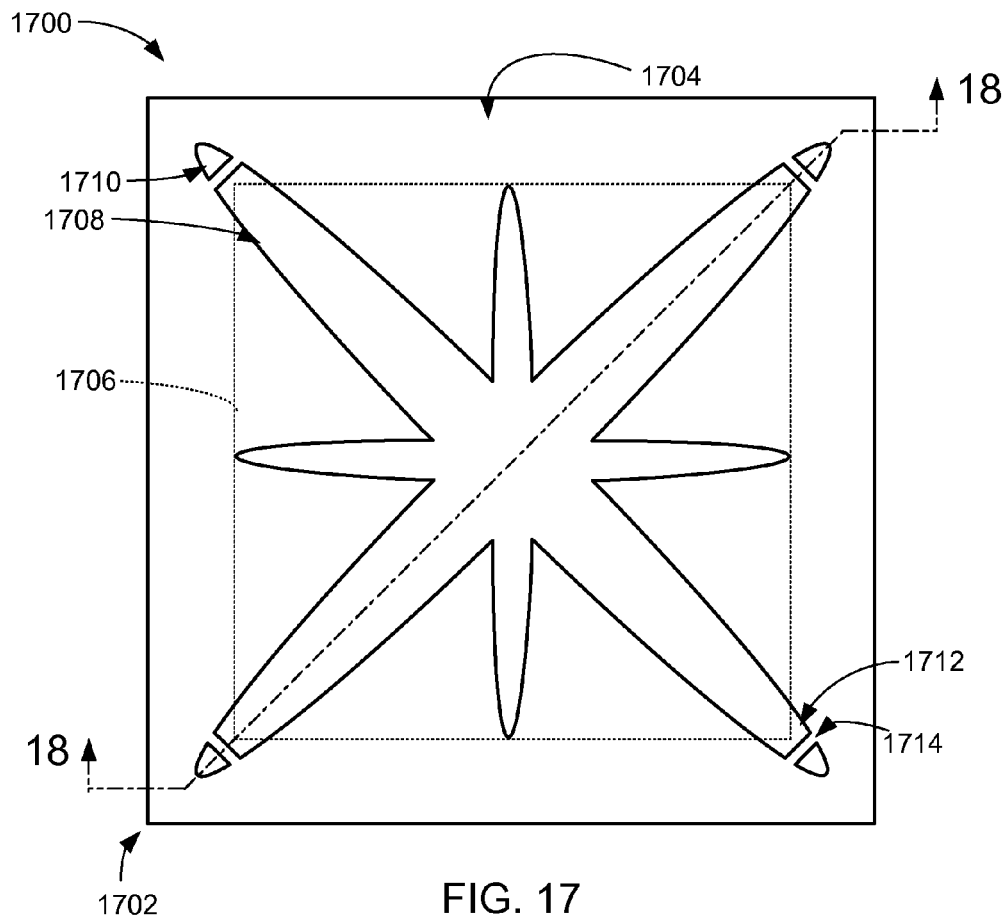
FIG. 17 is a top view of an integrated circuit mounting system in a ninth embodiment of the present invention.

Referring now to FIG. 17, therein is shown a top view of an integrated circuit mounting system 1700 in a ninth embodiment of the present invention. The integrated circuit mounting system 1700 includes a die paddle 1702 with a component side 1704 and a die mount area 1706 (shown with dotted lines) of the component side 1704. The die mount area 1706 represents a specific location and orientation on the die paddle 1702 of a component (not shown) having circuitry.

The die paddle 1702 provides a support structure for the component having circuitry, thermal dissipation for the component, a ground plane for the component, an electromagnetic shielding for the circuitry of the component, or a common electrical connect potential for a ground, a power, or an electrical signal. The die paddle 1702 can be formed of a conductive material that can include copper or copper alloy and can optionally include surface treatments such as a pre-plated film (ppF) or silver (Ag) although it is understood a surface of the die paddle 1702 can be bare.

The die paddle 1702 includes one or more of a recess 1708 and cavities 1710. The recess 1708 in the die paddle 1702 within and protruding from the die mount area 1706 and the cavities 1710 in the die paddle 1702 are formed using a forming process that can include a stamping process, a laser forming process, an etching process, a grinding process, a routing process, or a mechanized process method.

The cavities 1710 of the die paddle 1702 are formed outside the die mount area 1706. An interior of the recess 1708 or the cavities 1710 can optionally include surface treatments such as a pre-plated film (ppF) or silver (Ag) although it is understood surfaces of the recess 1708 and of the cavities 1710 can be bare.

The recess 1708 is formed having a combination of more than one geometric shapes such as lines, curves, or combinations thereof. For example, the recess 1708 can have a shape of an extended asterisk with a separated etching corner design.

The recess 1708 includes a first geometric shape, a second geometric shape, a third geometric shape, and a fourth geometric shape superimposed on one another. The first geometric shape has a shape of an elongated ellipse positioned from a center region of the die mount area 1706 with ends extending horizontally and equidistant from the center region to a perimeter sides of the die mount area 1706. The second geometric shape has a shape identical to the shape of the first geometric shape and is positioned from the center region with ends extending vertically and equidistant from the center region to perimeter sides of the die mount area 1706.

The third geometric shape has a shape of an elongated ellipse positioned from the center region with ends equidistant from the center region through opposing corners of the die mount area 1706. The fourth geometric shape has a shape identical to the shape of the third geometric shape and is positioned from the center region with ends and equidistant from the center region through opposing corners of the die mount area 1706 located between the opposing corners intersected by the ends of the third geometric shape.

The first geometric shape and the second geometric shape have a length that is at least nine times a width of the first geometric shape and the second geometric shape. The widths and lengths of the third geometric shape and the fourth geometric shape are at least twice the widths and lengths of the first geometric shape and the second geometric shape.

The recess 1708 is formed extending outside a perimeter of the die mount area 1706 with the ends of the third geometric shape and the fourth geometric shape protruding through corners of the die mount area 1706 forming a recess relief region 1712 of the recess 1708. The recess relief regions 1712 are separated from each other outside the die mount area 1706. The recess relief region 1712 is used to release excess matter including gasses, vapors, or adhesive material.

The recess relief region 1712 can include a vent-hole or outlet etching for containment of the excess matter. The opposite end of the fourth geometric shapes forms a flat side of the recess relief region 1712 that is perpendicular to a diagonal line intersecting opposite corners of the die mount area 1706.

The cavities 1710 are formed in the die paddle 1702 having a shape of a parabolic segment that includes a parabolic shaped side and with a flat side perpendicular to an axis of symmetry of the parabola.

For illustrative purposes, each of the cavities 1710 is shown protruding towards a corner of a perimeter of the component side 1704 with the flat side of the cavities 1710 parallel and facing the flat side of the recess relief region 1712. For example, any number of the cavities 1710 can be positioned and formed around the die mount area 1706. The perimeter of the die mount area 1706 can be surrounded by rows of the cavities 1710 that protrude towards the perimeter of the component side 1704.

The flat side of the cavities 1710 is separated from the recess relief region 1712 of the recess 1708 by a component side strip 1714. The component side strip 1714 is formed from a section of the component side 1704 and separates each of the cavities 1710 from the recess relief region 1712. The component side strip 1714 can be used to separate material within the cavities 1710 from material within the recess relief region 1712, limit a flow of material within the cavities 1710 into the recess relief region 1712, or limit a flow of material within the recess relief region 1712 into the cavities 1710. The component side strip 1714 can include a bridge, wall, or divider structure formed from the material of the die paddle 1702.

The component side strip 1714 and portions of the component side 1704 expose and surround the recess 1708 and the cavities 1710. The recess 1708 has an area that is between sixty percent and ninety percent of an area of the die mount area 1706. For example, the area of the recess 1708 can be between seventy percent and seventy-five percent of the area of the die mount area 1706.

Figure 18:
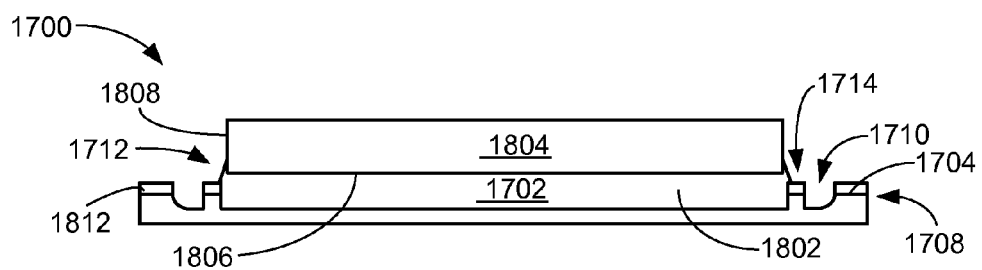
FIG. 18 is a cross-sectional view of FIG. 17 taken along line 18-18.

Referring now to FIG. 18, therein is shown a cross-sectional view of FIG. 17 taken along line 18-18. An adhesive 1802 is applied in the recess 1708 and on the die mount area 1706. The adhesive 1802 can cover all or portions of internal sides of the recess 1708 in a covering process. The covering process can include cleaning, injecting, or heating processes.

An integrated circuit device 1804 is attached directly on the adhesive 1802 with the adhesive 1802 covering an inactive side 1806 of the integrated circuit device 1804 using an attachment process. The inactive side 1806 refers to a side of the integrated circuit device 1804 not having active circuitry fabricated thereon or elements for connection to the active circuitry within the integrated circuit device 1804. The attachment process can include positioning, heating, cooling, or mechanical clamping processes.

The adhesive 1802 between the integrated circuit device 1804 and the die paddle 1702 is used to prevents movement of the integrated circuit device 1804, protect the inactive side 1806, or improve thermal transfer characteristics between the integrated circuit device 1804 and the die paddle 1702. The adhesive 1802 can include a die attach material, a glue, an epoxy, or a thermally conductive adhesive material.

For illustrative purposes, the integrated circuit device 1804 is shown having a length similar to the length of a perimeter of the die mount area 1706 of FIG. 17. The length and width of the integrated circuit device 1804 is less that a width and length of a perimeter of the recess 1708. The integrated circuit device 1804 can have different lengths or widths.

For example, the integrated circuit device 1804 can have a perimeter with a width and a length greater than or equal to a width and length of a perimeter of the recess 1708. The adhesive 1802 can cover all or a portion of a device side 1808 of the integrated circuit device 1804. The die paddle 1702 is shown having a surface layer 1812 such as one or more of the surface treatments. The surface layer 1812 can be optionally applied on the component side 1704 surrounding the recess 1708.

The surface layer 1812 can be applied anytime before or during the attachment process. The recess relief region 1712 exposed outside the perimeter of the die mount area 1706 provides a vent or outgassing outlet for the adhesive 1802 to prevent entrapment of gas or void formations between the inactive side 1806 and the recess 1708.

The component side strip 1714 separates vented or outgassed material from the adhesive 1802 within the recess relief region 1712 from entering the cavities 1710. The cavities 1710 provide an opening that is optionally filled with an encapsulation (not shown) to provide a locking feature between the encapsulation and the die paddle 1702.

Figure 19:
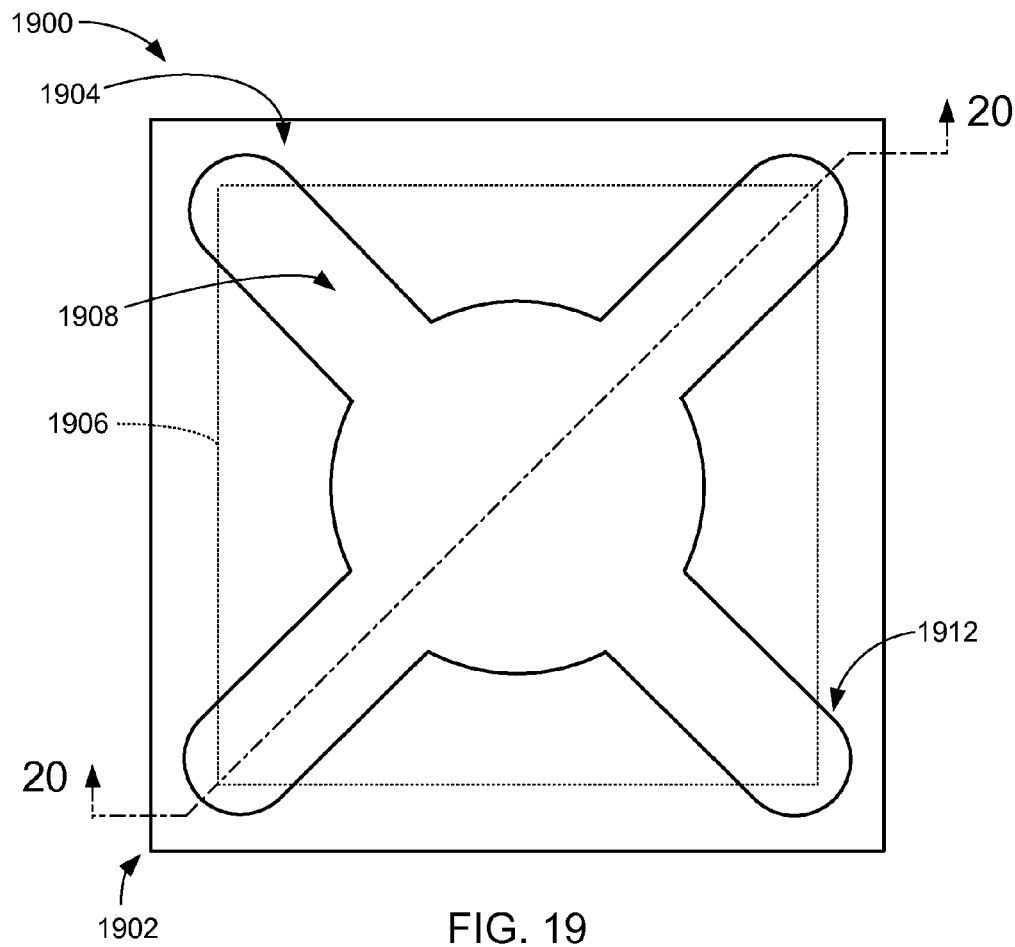
FIG. 19 is a top view of an integrated circuit mounting system in a tenth embodiment of the present invention.

Referring now to FIG. 19, therein is shown a top view of an integrated circuit mounting system 1900 in a tenth embodiment of the present invention. The integrated circuit mounting system 1900 includes a die paddle 1902 with a component side 1904 and a die mount area 1906 (shown with dotted lines) of the component side 1904. The die mount area 1906 represents a specific location and orientation on the die paddle 1902 of a component (not shown) having circuitry.

The die paddle 1902 provides a support structure for the component having circuitry, thermal dissipation for the component, a ground plane for the component, an electromagnetic shielding for the circuitry of the component, or a common electrical connect potential for a ground, a power, or an electrical signal. The die paddle 1902 can be formed of a conductive material that can include copper or copper alloy and can optionally include surface treatments such as a pre-plated film (ppF) or silver (Ag) although it is understood a surface of the die paddle 1902 can be bare.

The die paddle 1902 includes one or more of a recess 1908 formed in the die paddle 1902 within and protruding from the die mount area 1906 using a forming process that can include a stamping process, a laser forming process, an etching process, a grinding process, a routing process, or a mechanized process method. An interior of the recess 1908 can optionally include surface treatments such as a pre-plated film (ppF) or silver (Ag) although it is understood surfaces of the recess 1908 can be bare.

The recess 1908 is formed having a combination of more than one geometric shapes such as lines, curves, or combinations thereof. For example, the recess 1908 can have a shape of a centre with four corners slot half etch design.

The recess 1908 includes a first geometric shape and second geometric shapes. The first geometric shape has a shape of a circle with a center coincident with a center of the die mount area 1906. The circle has an area that is at least forty-five percent of an area of the die mount area 1906.

The second geometric shapes have a shape similar to a shape of a rod. The second geometric shapes each include a first end and a second end opposite the first end. Each of the second geometric shapes has a length at least three times a width of the second geometric shapes and has an area of at least eight percent of the area of the die mount area 1906. The second geometric shapes are located on diagonal lines that intersect opposite corners of the die mount area 1906.

The first end of each of the second geometric shapes is integral with the first geometric shape. The second end of each of the second geometric shapes has a convex shaped surface. A portion of the second end of each of the second geometric shapes overlaps and extends beyond a corner of the die mount area 1906.

The portion of second end of each of the second geometric shapes extending beyond the corner of the die mount area 1906 is referred to as a recess relief region 1912. The recess relief region 1912 is used to release excess matter including gasses, vapors, or adhesive material.

The component side 1904 exposes and surrounds the recess 1908. The recess 1908 has an area that is between sixty percent and ninety percent of an area of the die mount area 1906. For example, the area of the recess 1908 can be between seventy percent and seventy-five percent of the area of the die mount area 1906.

Figure 20:
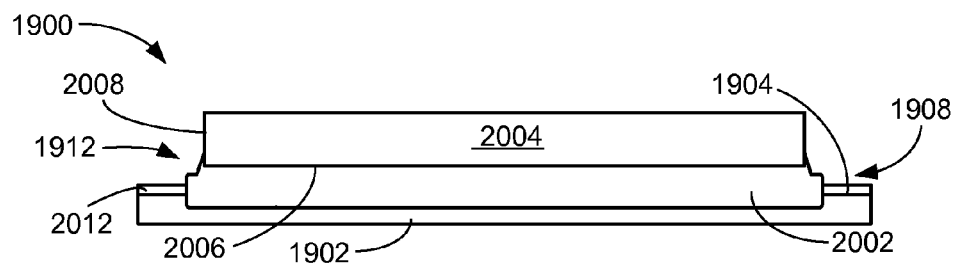
FIG. 20 is a cross-sectional view of FIG. 19 taken along line 20-20.

Referring now to FIG. 20, therein is shown a cross-sectional view of FIG. 19 taken along line 20-20. An adhesive 2002 is applied in the recess 1908 and on the die mount area 1906. The adhesive 2002 can cover all or portions of internal sides of the recess 1908 in a covering process. The covering process can include cleaning, injecting, or heating processes.

An integrated circuit device 2004 is attached directly on the adhesive 2002 with the adhesive 2002 covering an inactive side 2006 of the integrated circuit device 2004 using an attachment process. The inactive side 2006 refers to a side of the integrated circuit device 2004 not having active circuitry fabricated thereon or elements for connection to the active circuitry within the integrated circuit device 2004. The attachment process can include positioning, heating, cooling, or mechanical clamping processes.

The adhesive 2002 between the integrated circuit device 2004 and the die paddle 1902 is used to prevents movement of the integrated circuit device 2004, protect the inactive side 2006, or improve thermal transfer characteristics between the integrated circuit device 2004 and the die paddle 1902. The adhesive 2002 can include a die attach material, a glue, an epoxy, or a thermally conductive adhesive material.

For illustrative purposes, the integrated circuit device 2004 is shown having a length similar to the length of a perimeter of the die mount area 1906 of FIG. 19. The length and width of the integrated circuit device 2004 is less that a width and length of a perimeter of the recess 1908.

The integrated circuit device 2004 can have different lengths or widths. For example, the integrated circuit device 2004 can have a perimeter with a width and a length greater than or equal to a width and length of a perimeter of the recess 1908.

The adhesive 2002 can cover all or a portion of a device side 2008 of the integrated circuit device 2004. The die paddle 1902 is shown having a surface layer 2012 such as one or more of the surface treatments. The surface layer 2012 can be optionally applied on the component side 1904 surrounding the recess 1908.

The surface layer 2012 can be applied anytime before or during the attachment process. The recess relief region 1912 exposed outside the perimeter of the die mount area 1906 provides a vent or outgassing outlet for the adhesive 2002 to prevent entrapment of gas or void formations between the inactive side 2006 and the recess 1908.

Figure 21:
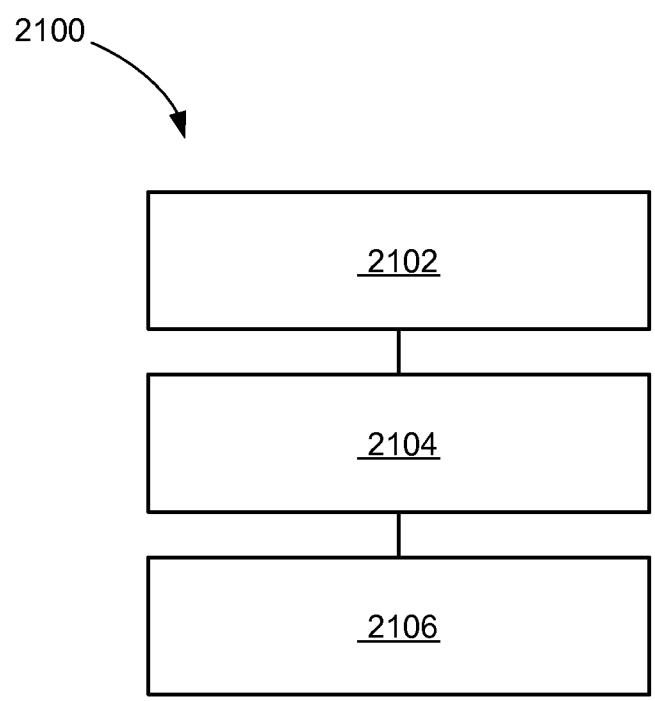
FIG. 21 is a flow chart of a method of manufacture of the integrated circuit mounting system in a further embodiment of the present invention.

Referring now to FIG. 21, therein is shown is a flow chart of a method 2100 of manufacture of the integrated circuit mounting system 100 in a further embodiment of the present invention. The method 2100 includes: providing a die paddle with a component side having a die mount area and a recess with more than one geometric shape in a block 2102; applying an adhesive on the die mount area and in a portion of the recess in a block 2104; and mounting an integrated circuit device with an inactive side directly on the adhesive in a block 2106.

Thus, it has been discovered that the integrated circuit mounting system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit mounting system comprising:
    providing a die paddle with a component side having a die mount area and a recess with more than one geometric shape including:
    a first geometric shape of a first ellipse positioned about a center region of the die mount area with ends extending horizontally and equidistant from the center region to a first perimeter side of the die mount area; and
    a second geometric shape of a second ellipse superimposed on the first geometric shape, the second geometric shape positioned about the center region of the die mount area with ends extending vertically and equidistant from the center region to a second perimeter side of the die mount area;
    a third geometric shape positioned about the center region of the die mount area with ends extending equidistant from the center region and protruding through corners of the die mount area and forming recess relief regions at the ends of the third geometric shape, the recess relief regions separated from each other;
    applying an adhesive on the die mount area and in a portion of the recess; and
    mounting an integrated circuit device directly on the adhesive.

2. The method as claimed in claim 1 wherein providing the die paddle with the recess includes forming the recess having the recess relief regions protruding through four corners of the die mount area.

3. The method as claimed in claim 1 further comprising forming a cavity in the die paddle.

4. The method as claimed in claim 1 further comprising applying a surface layer on the component side.

5. The method as claimed in claim 1 wherein providing the die paddle includes forming the die paddle having the recess with an area that is between sixty percent and ninety percent of an area of the die mount area.

6. A method of manufacture of an integrated circuit mounting system comprising:
    providing a die paddle with a component side having a die mount area and a recess with more than one geometric shape including:
    a first geometric shape of a first ellipse positioned about a center region of the die mount area with ends extending horizontally and equidistant from the center region to a first perimeter side of the die mount area; and
    a second geometric shape of a second ellipse superimposed on the first geometric shape, the second geometric shape positioned about the center region of the die mount area with ends extending vertically and equidistant from the center region to a second perimeter side of the die mount area;
    a third geometric shape positioned about the center region of the die mount area with ends extending equidistant from the center region and protruding through corners of the die mount area and forming recess relief regions at the ends of the third geometric shape, the recess relief regions separated from each other;
    forming a cavity in the die paddle;
    applying an adhesive on the die mount area and in a portion of the recess; and
    mounting an integrated circuit device directly on the adhesive.

7. The method as claimed in claim 6 wherein providing the die paddle with the recess includes forming the recess having the recess relief regions protruding from four corners of the die mount area.

8. The method as claimed in claim 6 wherein forming a cavity in the die paddle includes forming the cavity outside the die mount area.

9. The method as claimed in claim 6 further comprising applying a surface layer on the component side exposed from the recess.

10. The method as claimed in claim 6 wherein providing the die paddle includes forming the die paddle having the recess with an area that is between seventy percent and seventy-five percent of an area of the die mount area.

11. An integrated circuit mounting system comprising:
    a die paddle with a component side having a die mount area and a recess with more than one geometric shape including:
    a first geometric shape of a first ellipse positioned about a center region of the die mount area with ends extending horizontally and equidistant from the center region to a first perimeter side of the die mount area; and
    a second geometric shape of a second ellipse superimposed on the first geometric shape, the second geometric shape positioned about the center region of the die mount area with ends extending vertically and equidistant from the center region to a second perimeter side of the die mount area;
    a third geometric shape positioned about the center region of the die mount area with ends extending equidistant from the center region and protruding through corners of the die mount area and forming recess relief regions at the ends of the third geometric shape, the recess relief regions separated from each other;
    an adhesive on the die mount area and in a portion of the recess; and
    an integrated circuit device directly on the adhesive.

12. The system as claimed in claim 11 wherein the die paddle with the recess includes the recess having the recess relief regions protruding through four corners of the die mount area.

13. The system as claimed in claim 11 further comprising a cavity in the die paddle.

14. The system as claimed in claim 11 further comprising a surface layer on the component side.

15. The system as claimed in claim 11 wherein the die paddle includes the die paddle having the recess with an area that is between sixty percent and ninety percent of an area of the die mount area.

16. The system as claimed in claim 11 wherein the integrated circuit device includes a device side of the integrated circuit device covered by the adhesive.

17. The system as claimed in claim 16 wherein the die paddle with the recess includes the recess having a recess relief region protruding from the mount area.

18. The system as claimed in claim 16 further comprising a cavity in the die paddle, the cavity outside the die mount area.

19. The system as claimed in claim 16 further comprising a surface layer on the component side exposed from the recess.

20. The system as claimed in claim 16 wherein the die paddle includes the die paddle having the recess with an area that is between seventy percent and seventy-five percent of an area of the die mount area.

* * * * *